(12) United States Patent
Terashima et al.

(10) Patent No.: US 7,433,550 B2
(45) Date of Patent: Oct. 7, 2008

(54) OPTICAL MODULATOR AND CONTROL METHOD THEREFOR

(75) Inventors: Tokihiro Terashima, Tokyo (JP); Hiroshi Wada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 232 days.

(21) Appl. No.: 11/400,236

(22) Filed: Apr. 10, 2006

(65) Prior Publication Data

US 2007/0081756 A1   Apr. 12, 2007

(30) Foreign Application Priority Data

Sep. 27, 2005   (JP) .............................. 2005-279673

(51) Int. Cl.
  *G02F 1/035* (2006.01)
(52) U.S. Cl. .................. 385/3; 385/1; 385/2; 385/14; 385/40; 385/129; 385/130; 385/132
(58) Field of Classification Search .............. 385/1, 385/2, 3, 14, 39, 40, 129, 130, 131, 132
See application file for complete search history.

(56) References Cited

U.S. PATENT DOCUMENTS

| | | | | |
|---|---|---|---|---|
| 5,903,358 A | * | 5/1999 | Zare et al. ............. | 356/437 |
| 5,953,466 A | * | 9/1999 | Kubota et al. .......... | 385/2 |
| 6,111,681 A | * | 8/2000 | Mizrahi et al. .......... | 398/196 |
| 7,200,289 B2 | * | 4/2007 | Yamada et al. .......... | 385/3 |
| 2007/0081756 A1 | * | 4/2007 | Terashima et al. ....... | 385/3 |

FOREIGN PATENT DOCUMENTS

| | | |
|---|---|---|
| JP | 06-043411 | 2/1994 |
| JP | 2003-233047 | 8/2003 |

\* cited by examiner

*Primary Examiner*—Brian M Healy
(74) *Attorney, Agent, or Firm*—Volentine & Whitt, P.L.L.C.

(57) ABSTRACT

A Mach-Zehnder optical modulator capable of feed-back compensating a change due to an optical coupling loss, and the characteristic change peculiar to functional devices, and a control method therefore, are provided. A control method for a semiconductor Mach-Zehnder optical modulator using a laser device as a light source includes modulating light emitted from the laser device, and extracting the light as output light; detecting monitor light separate from the output light, among the optically modulated light; and feed-back controlling an optical output intensity of the laser device based on the monitor light.

9 Claims, 5 Drawing Sheets

OPTICAL MODULATOR AND CONTROL METHOD THEREFOR

CROSS REFERENCE TO RELATED APPLICATION

This application claims the priority of Application No. 2005-279673, filed on Sep. 27, 2005 in Japan, the subject matter of which is incorporated herein by reference.

BACKGROUND OF THE INVENTION

1. Field of the Invention

The present invention relates to an optical modulator mainly used for optical communication. In particular, the present invention relates to a semiconductor Mach-Zehnder optical modulator and a control method therefor.

2. Description of the Background Art

Recently, in order to realize a super high-speed and wideband optical communication network system, there is high expectation for an optical modulator of an external modulation method (external modulator). Particularly, in order to enable long-distance transmission of optical signals, development of a Mach-Zehnder (MZ) optical modulator using LiNbO3 (lithium niobate; LN) (MZ type LN optical modulator) and having excellent high-speed modulation properties and dispersion resistance in a wideband is under way.

Generally, a Mach-Zehnder device includes two parallel phase modulated optical waveguides, an electrode for applying a voltage to these waveguides, and two Y branches on an input side (first stage) and an output side (second stage). When light enters an input optical waveguide, the light branched in the Y branch in the first stage propagates respectively in the two parallel phase modulated optical waveguides by the same distance, is recoupled in the Y branch in the second stage, and is emitted from an output signal optical waveguide.

In a state where a voltage is not applied to the phase modulated optical waveguides, there is no change in the refractive index of the waveguides, and hence a phase difference of the light propagating in the two phase modulated optical waveguides is 0°, that is, the coupled signal has the same signal size as that of the signal before being coupled. Conversely, when a voltage is applied so that the phase difference between the two guided waves becomes 180°, the coupled signals serve to negate each other. Thus, the output signal can be used as a modulation signal in an ON or OFF state according to the intensity of light, by changing the phase difference of the light propagating in the two optical waveguides, by applying a voltage.

In the MZ type LN optical modulator, the operating point fluctuates due to temperature drift, DC drift, or the like. Therefore, to compensate for this, a bias voltage may be applied to an optical modulator optical waveguide.

In conventional semiconductor Mach-Zehnder optical modulators, there is one having a structure in which, for example, a semiconductor Mach-Zehnder device, a laser device as a light source, an optical coupling lens, an optical fiber, an isolator, a temperature controlling Peltier element, and an automatic optical output controlling monitor photodiode device (hereinafter, referred to as "monitor PD") are hybrid-integrated. As described above, the semiconductor Mach-Zehnder device functions as a shutter, which transmits or intercepts laser beams incident on the waveguide, by using a change in the refractive index of the waveguide produced in proportion to the applied voltage. On the reception side, the intensity of light transmitted through the optical fiber line is identified, to reproduce the light in a "high" or "low" electric signal.

In the semiconductor Mach-Zehnder optical modulator, due to temperature characteristics peculiar firstly to the semiconductor Mach-Zehnder device, and also to built-in functional devices such as the laser device and the isolator, modulation outputs change considerably due to not only ambient temperature but also to generation of heat in internal devices. Consequently, it is necessary to compensate for the characteristic fluctuations due to temperature change. Therefore, temperature control has been heretofore performed by a Peltier element. That is, the temperature change in a thermistor resistance is fed-back to perform the temperature control using endothermic and exothermic heat of the Peltier element. As a result, optical propagation loss inside the semiconductor Mach-Zehnder device, and a decrease in the optical output of the laser device can be suppressed.

Japanese Unexamined Patent Publication No. 2003-233047 discloses a Mach-Zehnder type LN optical modulator, in which a bias voltage is applied to the optical waveguide in order to compensate for a change in the operating point due to temperature drift, DC drift, or the like. Specifically, feedback control is performed for controlling the bias voltage to be applied to the optical waveguide based on the intensity of the output light of the monitoring optical waveguide. As a result, the change in the operating point voltage is compensated for.

[Patent Document 1] Japanese Unexamined Patent Publication No. 2003-233047

Furthermore, Japanese Unexamined Patent Publication No. Hei 6-43411 discloses a technique for controlling the bias voltage to be applied to the optical waveguide to control the operating point voltage of the optical modulator, as in the invention disclosed in Japanese Unexamined Patent Publication No. 2003-233047.

[Patent Document 2] Japanese Unexamined Patent Publication No. H06-43411

The temperature control method using the Peltier element, and the automatic optical output control method for monitoring the optical output intensity at the back of the laser device are used in many optical coupling modules. However, these methods cannot compensate for an optical loss when imperfect alignment occurs in an optical coupling section between the laser device and the Mach-Zehnder device. Moreover, complete compensation is not possible with respect to variable factors such as temperature characteristics and a change with the lapse of time, peculiar to integrated functional devices such as the Mach-Zehnder device and the isolator. Accordingly, there is a problem in that a sufficient effect cannot be obtained as a means for compensating for fluctuations in the modulation output. Particularly in a hybrid module in which functions and density are both highly integrated, such as in the semiconductor Mach-Zehnder modulator, characteristic compensation with respect to complex variable factors is not easy.

Here, optical loss when imperfect alignment occurs in the optical coupling section is taken into consideration. FIG. 5 depicts a general optical coupling loss characteristic (broken line) between the laser device and the semiconductor Mach-Zehnder device in the case of using a ball lens, and an optical coupling loss characteristic (solid line) due to collimator coupling between the laser device and the semiconductor Mach-Zehnder device. As seen from FIG. 5, deterioration of the optical coupling loss (solid line) due to imperfect alignment of the semiconductor Mach-Zehnder device is larger than that of the optical coupling loss (broken line) due to the imperfect alignment of a single mode fiber. It is considered that this results from coupling of semiconductor devices having a small optical mode size. Thus, in the case of an optical coupling module (the semiconductor Mach-Zehnder modulator) which is extremely sensitive to imperfect alignment, a difference in the thermal expansion coefficient of the components, or slight imperfect alignment due to stress distortion, due to the ambient temperature of the modulator or an external force, affects the semiconductor Mach-Zehnder modulator. As a result, the loss increases abruptly, and the modulation output is likely to change.

On the other hand, for the temperature characteristic change of the functional devices such as the semiconductor Mach-Zehnder device, the quality of the suppression effect is determined based on how accurately the temperature change in the vicinity of the devices can be feed-back controlled. Therefore, it is essential to optimize the heat transfer characteristics and heat radiation design, and to perform complicated heat design and analysis. However, these methods are not to directly monitor the characteristic change of the devices, but to control the characteristic change of the devices indirectly by feed-back controlling the ambient temperature change. Therefore, a sufficient compensation effect cannot be obtained, and instability occurs in the modulation output.

SUMMARY OF THE INVENTION

Accordingly, an object of the present invention is to provide a Mach-Zehnder optical modulator capable of feed-back compensating a change due to an optical coupling loss, and the characteristic change peculiar to the functional devices.

Another object of the present invention is to provide a control method for the Mach-Zehnder optical modulator capable of feed-back compensating a change due to an optical coupling loss, and the characteristic change peculiar to the functional devices.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

According to a first aspect of the present invention, a control method for a Mach-Zehnder optical modulator using a laser device as a light source includes: a step for modulating light emitted from the laser device, and extracting the light as output light; a step for detecting monitor light separate from the output light, among the optically modulated light; and a step for feed-back controlling an optical output intensity of the laser device based on the monitor light.

According to a second aspect of the present invention a Mach-Zehnder optical modulator includes: a Mach-Zehnder device which modulates the phase of incident light; a laser device which outputs light entering said Mach-Zehnder device; an input side branch section which branches light output from the laser device and guides the branched light to the Mach-Zehnder device; an output side branch section which couples the light output from the Mach-Zehnder device; an output signal optical waveguide connected to the output side branch section, which guides the output signal of the modulator; a monitoring optical waveguide separate from the output signal optical waveguide and connected to the output side branch section; a photodetector which detects monitor light guided by the monitoring optical waveguide; and a controller which feed-back controls an optical output intensity of the laser device based on the output signal of the photodetector.

In any of the first and the second aspects of the present invention, a stable modulation output signal can be transmitted to the optical fiber line, by directly feed-back controlling the fluctuations due to the optical coupling loss, and the characteristic change peculiar to the functional devices.

Preferably the Mach-Zehnder optical modulator uses a semiconductor substrate as a substrate. Moreover, at the time of detecting the monitor light, it is preferable to make the monitor light enter a light-receiving surface of a photodetector, inclined by 0° to 20° from a perpendicular line, and/or to highly refract the monitor light incident on the photodetector.

DETAILED DESCRIPTION OF THE PREFERRED EMBODIMENTS

Figure 1:
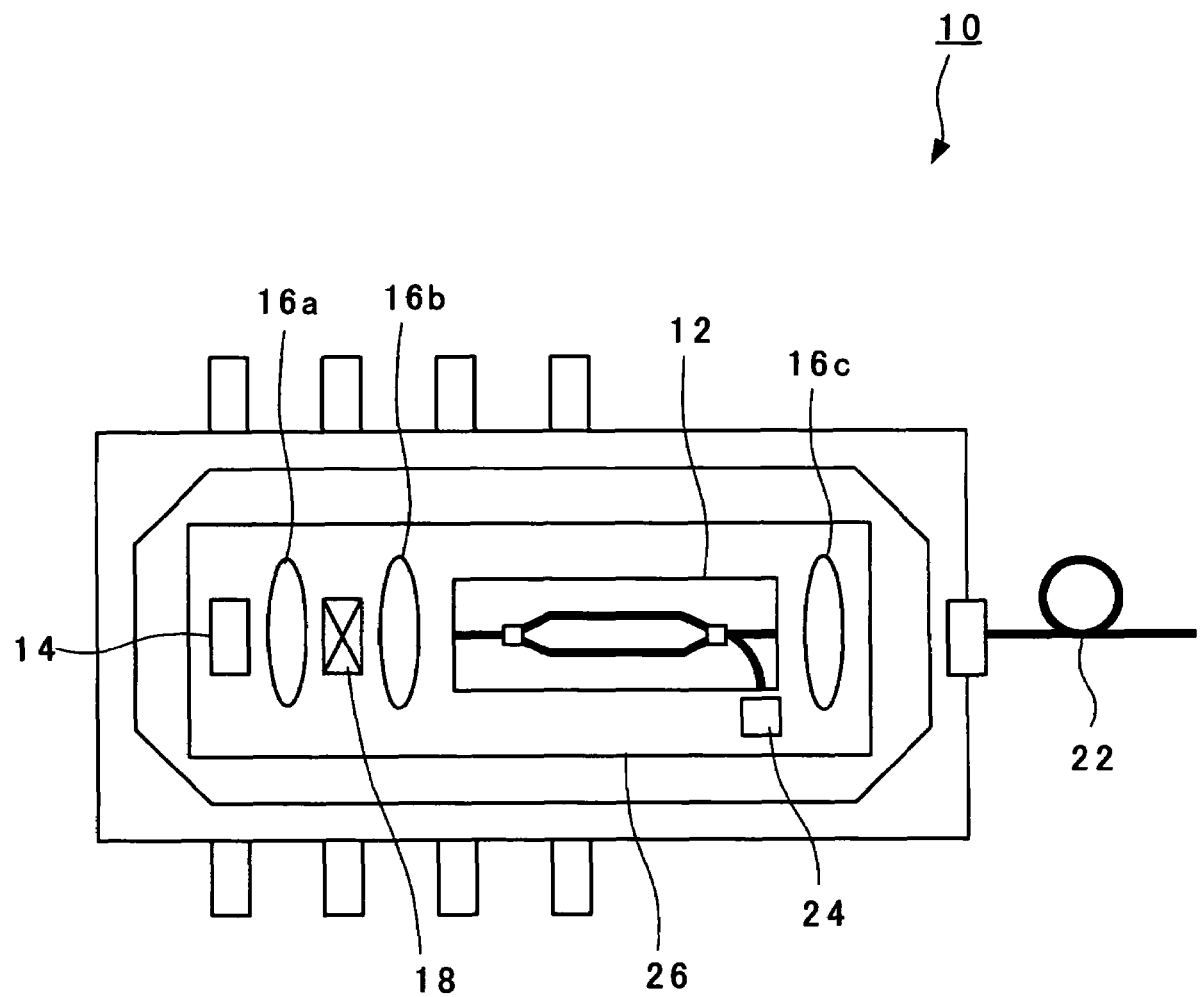
FIG. 1 is a plan view showing a configuration of a semiconductor Mach-Zehnder optical modulator according to an embodiment of the present invention.

The best mode for carrying out the invention will be explained in detail by way of examples. FIG. 1 is a plan view showing a configuration of a semiconductor Mach-Zehnder optical modulator 10 according to an embodiment of the present invention. The semiconductor Mach-Zehnder optical modulator 10 has a structure in which a semiconductor Mach-Zehnder device 12, a laser device 14 as a light source, optical coupling lenses 16a, 16b, and 16c, an output optical fiber 22, an isolator 18, a temperature controlling Peltier element 26, and an automatic optical output controlling monitor photodiode device 24 (hereinafter, referred to as "monitor PD") for the laser device 14, are hybrid-integrated.

As the semiconductor laser (laser device) 14, a DFB laser, a wavelength variable tunable laser, or the like can be used. Laser beams emitted from the semiconductor laser 14 enter the semiconductor Mach-Zehnder device 12 via the optical coupling lens 16a, the isolator 18, and the optical coupling lens 16b. The output light of the semiconductor Mach-Zehnder device 12 enters the optical fiber 22 via the optical coupling lens 16c. The output light of the semiconductor Mach-Zehnder device 12 also enters the monitor PD 24.

The semiconductor Mach-Zehnder device 12 functions as a shutter which transmits or intercepts the laser beams incident on the waveguide, by using a change in the refractive index of the waveguide produced in proportion to the applied voltage. On the reception side, the intensity of light transmitted through the optical fiber line is identified, to reproduce the light in a "high" or "low" electric signal.

Figure 2:
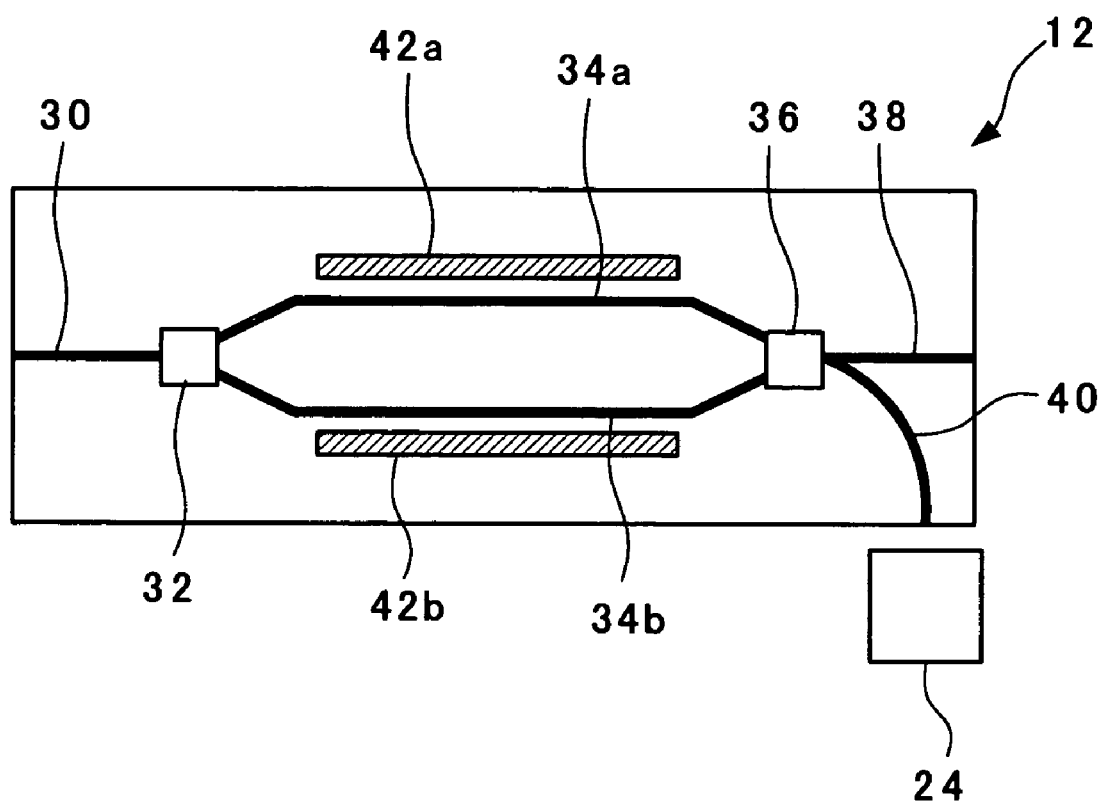
FIG. 2 is a plan view showing the structure of the semiconductor Mach-Zehnder device according to the embodiment.

FIG. 2 is a plan view showing the structure of the semiconductor Mach-Zehnder device 12 according to the embodiment. The semiconductor Mach-Zehnder device 12 includes an input optical waveguide 30, two parallel phase modulated optical waveguides 34a and 34b, electrodes 42a and 42b for applying a voltage to the phase modulated optical waveguides 34a and 34b, a Y branch 32 on the input side, a Y branch 36 on the output side, an output signal optical waveguide 38, and a monitoring optical waveguide 40 for detecting the intensity of the guided wave.

The semiconductor Mach-Zehnder device 12 according to the embodiment has two output ports, that is, the output signal optical waveguide 38, and the monitoring optical waveguide 40. The monitor PD 24 is hybrid mounted on an output terminal of the monitoring optical waveguide 40, so as to perform automatic optical output control of the laser device 14.

Preferably the semiconductor Mach-Zehnder device 12 in the embodiment is formed on a semiconductor substrate, but the semiconductor Mach-Zehnder device 12 is also applicable to a structure using a dielectric material such as lithium niobate ($LiNbO_3$). For the semiconductor substrate, gallium arsenide (GaAs), indium phosphorus (InP), and the like can be used. Normally, a silica glass is used as the waveguide, but the refractive index thereof is as small as 1.7. Therefore, confinement of light is weak, and there is the possibility that the light leaks out when the curvature of the waveguide is made small. On the other hand, since the refractive index of the semiconductor is as large as 3.2, confinement of light is strong, and the curvature of the semiconductor can be made relatively small, and hence, it is advantageous for miniaturization.

The light incident on the input optical waveguide 30 is branched at the Y branch 32, and guided through the respective phase modulated optical waveguides 34a and 34b. The phases of the respective guided waves are changed by applying an externally modulated voltage signal to the electrodes 42a and 42b, and are then coupled at the Y branch 36 and interfere with each other.

For example, when the phase difference between the respective guided waves is 0°, interference light (all of the output light) is wave-guided to the output signal optical waveguide 38. On the other hand, when the phase difference is 180°, the interference light (all of output light) is wave-guided to the monitoring optical waveguide 40. Alternatively, converse to this, the configuration may be such that when the phase difference between the respective guided waves is 180°, the interference light (all of output light) is wave-guided to the output signal optical waveguide 38, and when the phase difference is 0°, the interference light (all of output light) is wave-guided to the monitoring optical waveguide 40.

That is, in the embodiment, the Mach-Zehnder device 12 emits light complementarily from the two output ports (38, 40). This follows the ON/OFF of the electric modulation signal of the Mach-Zehnder device 12.

The design of the Y branch 36 can be realized by multimode interference (MMI) technology. Several light waves are created by refracting the light incident on the MMI. Light which interferes with each other and intensifies is extracted as a signal. Here, 2×2 MMI is designed, and at a position where the interference light is intensified (a position where the light again enters the waveguide from the MMI), the light is divided into left and right according to the phase. That is, a branching position and a branching ratio are selected according to an optimized design of the branching waveguide shape of the MMI.

In the embodiment, since unnecessary light is complementarily wave-guided to the monitor port (40) without branching the signal light for the monitor signal, there is substantially no optical loss. Moreover, since monitoring of the monitor light is equivalent to monitoring of the signal light, an intensity change in the modulation signal can be accurately ascertained.

Figure 3:
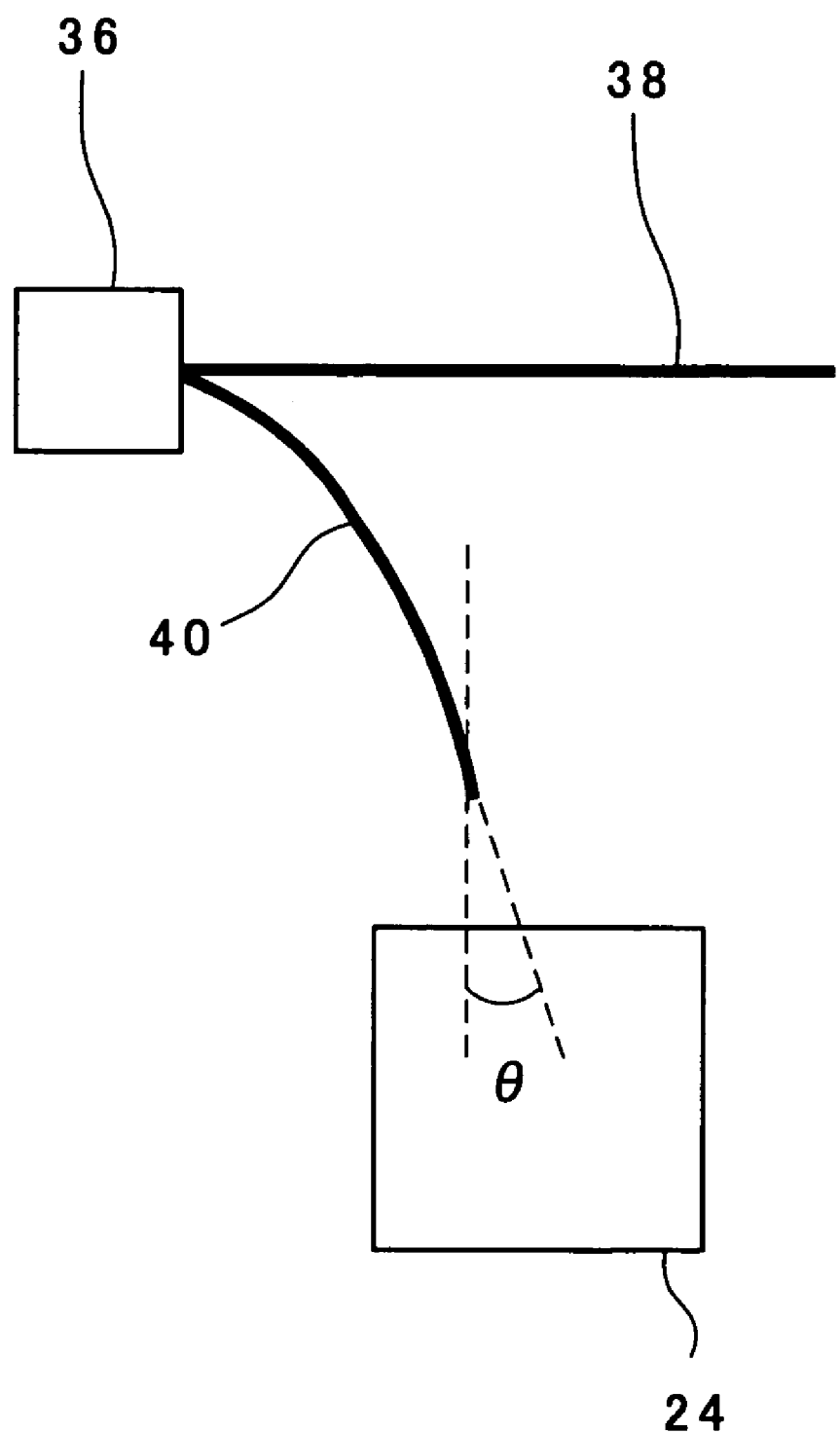
FIG. 3 is an explanatory diagram showing the structure of the semiconductor Mach-Zehnder optical modulator in the vicinity of a monitor PD according to the embodiment.

FIG. 3 depicts a configuration of an optical coupling section between the monitor PD 24 and the monitoring optical waveguide 40. The monitoring optical waveguide 40 is formed so as to guide the light to extract the monitor signal from the side face of the semiconductor Mach-Zehnder device 12 by a bending waveguide, and the monitor PD 24 is hybrid-mounted on the output terminal of the monitoring optical waveguide 40. The output terminal of the monitoring optical waveguide 40 is inclined by an angle θ with respect to a perpendicular direction to the side face of the semiconductor Mach-Zehnder device 12. Since the light from the output terminal of the monitoring optical waveguide 40 is inclined by the angle θ from the perpendicular line with respect to the light-receiving surface of the monitor PD 24, the reflected return light to the laser device 14 is reduced or prevented.

At the time of setting the angle θ, the angle is set to about 0° to 20°, close to the Brewster angle at which the light is actually totally reflected.

When the output terminal of the monitoring optical waveguide 40 is designed to be perpendicular (θ=0°) with respect to the side face of the semiconductor Mach-Zehnder device 12, since the refractive index of the waveguide is higher than that of the air, much reflected return light recouples with the monitoring optical waveguide 40. When the reflected return light recouples with the laser device 14, laser oscillation is interrupted and the modulation output becomes unstable. Particularly, if the isolator 18 is not arranged between the laser device 14 and the semiconductor Mach-Zehnder device 12, this phenomenon becomes noticeable. Therefore, as in the embodiment, by setting the angle of the optical axis on the output end face of the monitoring optical waveguide 40 within a critical angle in which the light is totally reflected, as an antireflection measure, the reflected return light to the laser device 14 can be reduced, and stable modulation output can be realized.

Furthermore, when a resin having a high refractive index is applied to the optical coupling between the output end face of the monitoring optical waveguide 40 and the monitor PD 24, a similar antireflection effect can be obtained by index matching. Here, the resin having a high refractive index is a resin having a lower refractive index than that of the semiconductor substrate, and for example, an epoxy resin or a silicone resin can be used. The resin is applied to between the output end face of the Mach-Zehnder monitor light, and the end face of the PD light-receiving section, by using a dispenser. At this time, the resin is applied carefully so as to cover the end face of the semiconductor waveguide and the end face of the PD light-receiving section completely, so that the end faces of these are not brought into contact with the air (a medium having a small refractive index). Furthermore, the resin is applied carefully so that the resin shape between both end faces is not a depressed shape, and bubbles do not enter the resin.

Furthermore, in order to increase the light confinement effect, the monitoring optical waveguide 40 is designed so as to have a higher refractive index than the surroundings. As a result, optical loss due to bending of the waveguide can be reduced, and the element size can be decreased.

Figure 4:
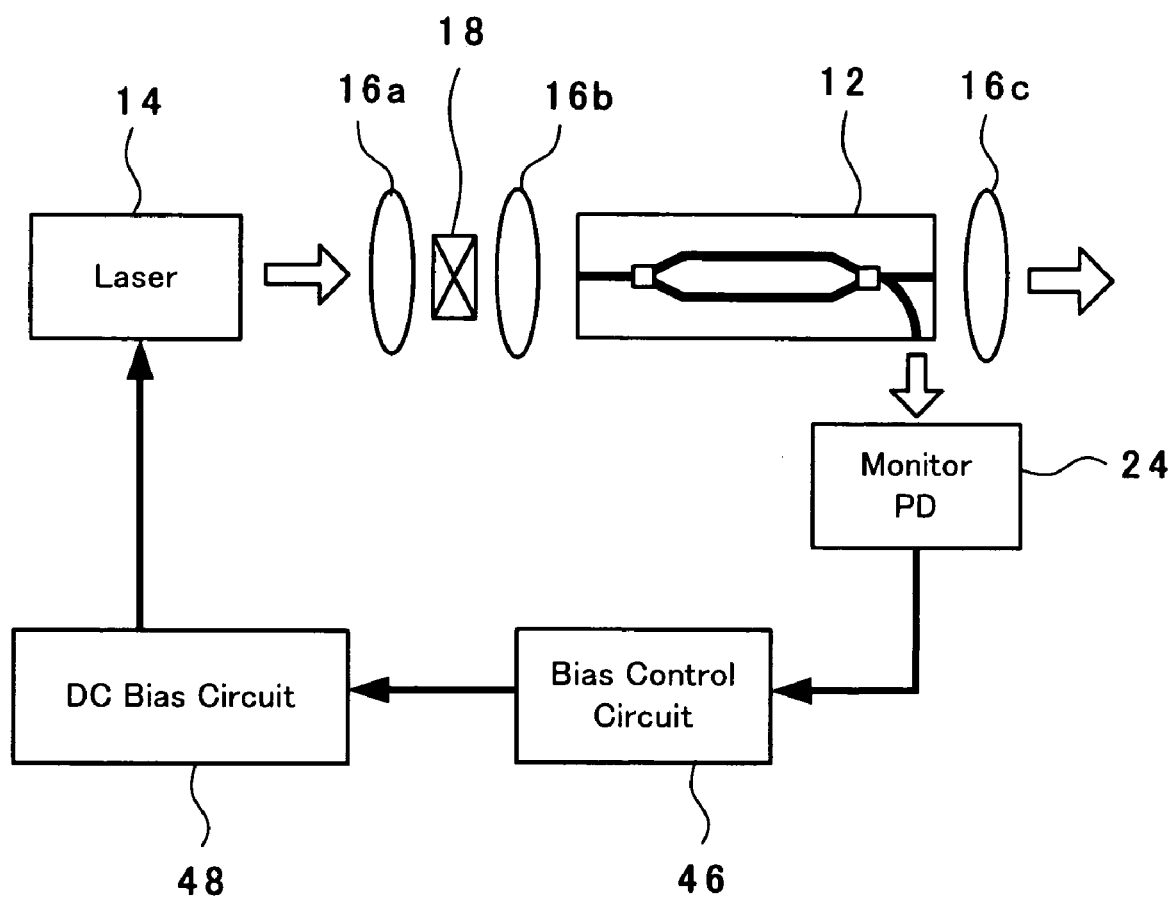
FIG. 4 is a block diagram showing a control configuration of the semiconductor Mach-Zehnder optical modulator according to the embodiment.
Figure 5:
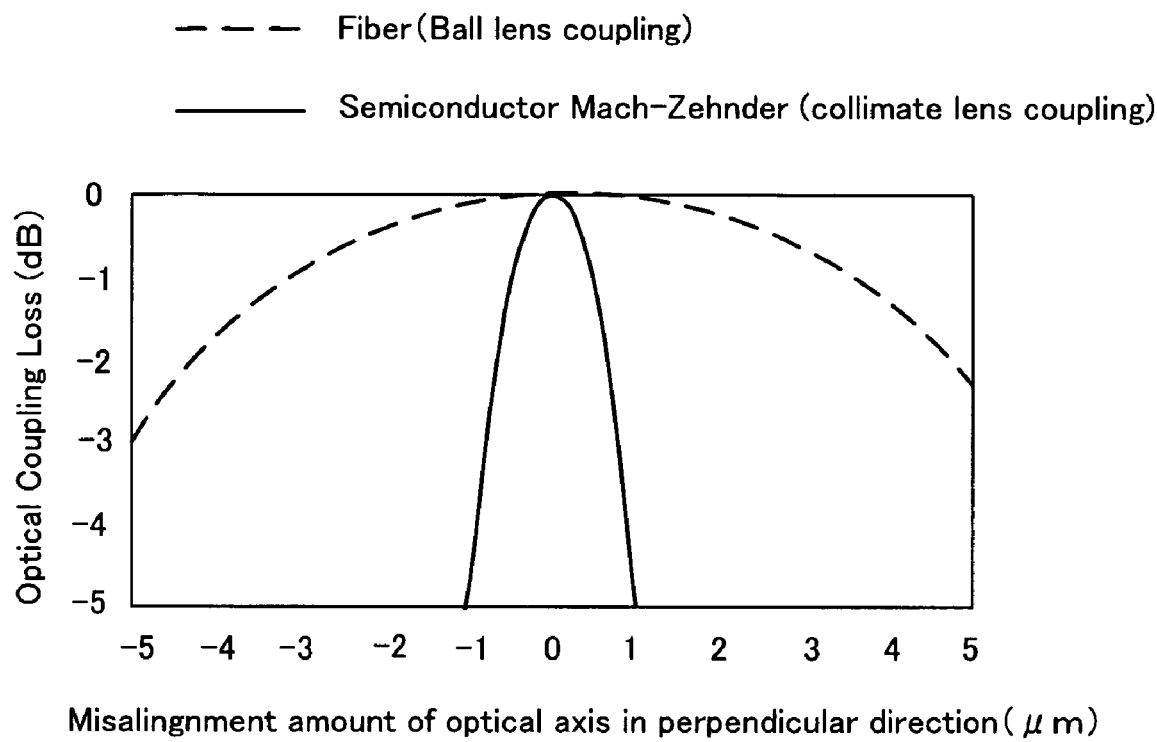
FIG. 5 is a graph showing the relation between misalignment amount of an optical axis in a perpendicular direction, and optical coupling loss.

FIG. 4 is a block diagram showing a control configuration of the semiconductor Mach-Zehnder optical modulator 10 according to the embodiment. As shown in FIG. 4, an output terminal of the monitor PD 24 is connected to an input terminal of a bias control circuit 46. An output terminal of the bias control circuit 46 is connected to an input terminal of a DC bias circuit 48. Moreover, the optical output (intensity) of the laser device 14 is controlled by the DC bias circuit 48. In the embodiment, one of the important configurations is that the output intensity of the laser device 14 is directly controlled.

The interference light coupled by the Y branch 36 is waveguided to the output signal optical waveguide 38 or to the monitoring optical waveguide 40 corresponding to the phase difference, and is alternately output for each modulation cycle. The guided wave from the monitoring optical waveguide 40 is received by the monitor PD 24, and the obtained monitor PD current is designated as a feedback signal for the automatic optical output control of the laser device 14.

In the embodiment, since the optical output in front of the laser device 14 is feedback-controlled as a monitor signal, as compared to the conventional device which monitors the optical output at the back of the laser device, the loss fluctuations due to the imperfect alignment of the optical axis in the optical coupling section, and the characteristic fluctuations of the respective functional devices are all detected as a change in the monitor signal. Therefore, these changes can be compensated for collectively. Since the monitor signal and the output signal are alternately emitted from the respective ports for each modulation cycle, there is merit in that there is no extra optical loss for detecting the monitor signal with respect to the output signal. Furthermore, since the monitor signal has an optical intensity as large as that of the output signal, the design range of the monitor current value used for the feedback signal can be made wide.

Generally, when a large monitor current value is required for the feed-back control signal, a measure for increasing the driving current of the laser device is required by changing a before and after ratio of the optical output intensity of the laser device, or intentionally decreasing the coupling efficiency of the laser device and the optical fiber, thereby causing a characteristic problem or placing a burden on the production. Another effect due to the present invention is that the semiconductor Mach-Zehnder device can be optically coupled and aligned with the laser device without feeding power, by substituting the monitor signal. Since the photoelectric conversion efficiency of the monitor PD is larger than that of the semiconductor Mach-Zehnder device, by using the monitor PD current, the alignment process can be simplified, and the alignment time can be reduced.

What is claimed is:

1. A control method for a Mach-Zehnder optical modulator using a laser device as a light source, comprising:
   modulating light emitted from said laser device optically, and extracting the modulated light as output light;
   detecting monitor light separate from said output light, among the optically modulated light; and
   feed-back controlling an optical output intensity of said laser device in accordance with said monitor light,
   said Mach-Zehnder optical modulator uses a semiconductor substrate as a substrate, and
   said monitor light incident on said photodetector is refracted via a resin having a lower refractive index than that of said substrate.

2. A control method according to claim 1, wherein at a time of detecting said monitor light, said monitor light is made to enter a light-receiving surface of a photodetector inclined by 0° to 20° from a perpendicular line of the photodetector.

3. A control method according to claim 1, wherein when a phase difference between two optically modulated guided waves is 0°, interference light from the two optically modulated guided waves is used as said output light, and conversely, when the phase difference is 180°, the interference light is used as said monitor light.

4. A control method according to claim 1, wherein when a phase difference between two optically modulated guided waves is 180°, interference light from the two optically modulated guided waves is used as said output light, and conversely, when the phase difference is 0, the interference light is used as said monitor light.

5. A Mach-Zehnder optical modulator comprising: a Mach-Zehnder device which modulates phase of incident light; a laser device which provides light for said Mach-Zehnder device; an input side branch section which branches light output from said laser device and guides the branched light to said Mach-Zehnder device; an output side branch section which couples light output from said Mach-Zehnder device; an output signal optical waveguide connected to said output side branch section, which guides the light output from the Mach-Zehnder device; a monitoring optical waveguide separate from said output signal optical waveguide and connected to said output side branch section; a photodetector which detects monitor light guided by said monitoring optical waveguide; and a controller which feed-back controls an optical output intensity of said laser device based on an output signal of said photodetector, wherein a semiconductor substrate is used as a substrate, and a resin having a lower refractive index than that of said semiconductor substrate is applied to optical coupling between an output end face of said monitoring optical waveguide and said photodetector.

6. A Mach-Zehnder optical modulator according to claim 5, wherein an output terminal of said monitoring optical waveguide is arranged on a side face of said Mach-Zehnder device.

7. A Mach-Zehnder optical modulator according to claim 5, wherein a direction of an optical axis on an output end face of said monitoring optical waveguide is inclined by 0° to 20° from a perpendicular line with respect to a light-receiving surface of said photodetector.

8. A Mach-Zehnder optical modulator according to claim 5, wherein when a phase difference between two optically modulated guided waves in said Mach-Zehnder device is 0°, said output side branch section guides interference light from the two optically modulated guided waves to said output signal optical waveguide, and when the phase difference is 180°, said output side branch section guides the interference light to said monitoring optical waveguide.

9. A Mach-Zehnder optical modulator according to claim 5, wherein when a phase difference between two optically modulated guided waves in said Mach-Zehnder device is 18020 , said output side branch section guides interference light from the two optically modulated guided waves to said output signal optical waveguide, and when the phase difference is 0°, said output side branch section guides the interference light to said monitoring optical waveguide.

* * * * *